United States Patent
Kitajima et al.

(10) Patent No.: US 6,837,755 B1
(45) Date of Patent: Jan. 4, 2005

(54) FUSE HOLDER COMPONENT

(75) Inventors: Yoshikazu Kitajima, Kawagoe (JP); Iwao Nishimura, Goshogawara (JP); Koji Ito, Goshogawara (JP)

(73) Assignee: Kyoshin Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/685,401

(22) Filed: Oct. 16, 2003

(30) Foreign Application Priority Data

Sep. 3, 2003 (JP) ........................................ 2003-311657

(51) Int. Cl.[7] .............................................. H01R 4/48
(52) U.S. Cl. ...................................... 439/830; 439/832
(58) Field of Search ................................ 439/830, 831, 439/832, 83, 621, 622; 361/626; 337/229, 215

(56) References Cited

U.S. PATENT DOCUMENTS 4,547,036 A * 10/1985 Keglewitsch et al. ....... 439/680
5,391,098 A * 2/1995 Ohashi ........................ 439/830
5,632,629 A * 5/1997 Legrady ........................ 439/78

FOREIGN PATENT DOCUMENTS

JP 49-151262 12/1974

* cited by examiner

*Primary Examiner*—Alex Gilman
(74) *Attorney, Agent, or Firm*—Birch, Stewart, Kolasch & Birch, LLP.

(57) ABSTRACT

A fuse holder component includes a bottom plate fixed to a printed board, and first and second side plates whose main body portions individually extend from side edges of the bottom plate. The second side plate includes a suction portion extending through an extension portion from the main body portion and provided with a suction surface to which a suction nozzle of a mounter is accessible. A pair of fuse holder components, surface-mounted on the printed board by using the mounter, constitute a fuse holder that stably holds a glass-tube fuse.

14 Claims, 3 Drawing Sheets

FUSE HOLDER COMPONENT

This nonprovisional application claims priority under 35 U.S.C. §119(a) on patent application No(s). 2003-311657 filed in JAPAN on Sep. 3, 2003, which is herein incorporated by reference.

BACKGROUND OF THE INVENTION

1. Technical Field

The present invention relates to a fuse holder for holding a glass-tube fuse, and more particularly, to a component of a fuse holder suitable for surface mount of a glass-tube fuse on a printed board.

2. Related Art

A fuse holder used to mount a glass-tube fuse on a printed board comprises a pair of holder fitments made of metal, as disclosed for instance in Japanese provisional utility model publication no. 49-151262. Each holder fitment includes a leg portion and a pair of arm portions formed integrally therewith. The holder fitments are disposed at a distance from each other on a printed board, with their leg portions inserted into mounting holes formed in the printed board, and are soldered at the leg portions to a patterned surface of the printed board. Each holder fitment is further provided with an auxiliary arm portion that cooperates with the arm portions to three-point support a corresponding one of metal caps of the glass-tube fuse inserted between the holder fitments.

The aforementioned conventional fuse holder is capable of holding a glass-tube fuse and electrically connecting the metal caps of the glass-tube fuse to a patterned surface of a printed board, however, it is not suitable to surface mount a glass-tube fuse on a printed board.

In recent years, electrical components have been surface mounted on a printed board by using a mounter provided with a suction nozzle, and hence there is a demand also for a glass-tube fuse being surface mounted on a printed board. However, the aforementioned conventional fuse holder is not designed to be capable of being picked up by means of a suction nozzle of a mounter., making it difficult for the mounter to surface mount a glass-tube fuse on a printed board.

SUMMARY OF THE INVENTION

An object of the present invention is to provide a component of a fuse holder suitable for surface mounting a glass-tube fuse on a printed board by using a mounter provided with a suction nozzle.

A fuse holder component of this invention comprises: a bottom plate adapted to be fixed to a printed board; a first side plate having a main body portion obliquely extending from one side edge of the bottom plate upward and inward in a width direction of the bottom plate; and a second side plate including a main body portion and a suction portion extending from an axially outer half of the main body portion. The main body portion of the second side plate cooperates with the main body portion of the first side plate to hold a cap of a glass-tube fuse, and the suction portion has a suction surface to which a suction nozzle of a mounter is accessible.

According to the present invention, the fuse holder component is sucked by a suction nozzle of a mounter and transported by the mounter to a predetermined position on a printed board, and the bottom plate of the fuse holder component is soldered to the printed board, whereby the fuse holder component is surface mounted on the printed board. Similarly, another fuse holder component of the same type is surface mounted on the printed board at a distance from the fuse holder component that has already been surface mounted thereon. These two fuse holder components, serving as a fuse holder, hold a glass-tube fuse inserted therebetween by holding caps of the fuse between their first and second side plates, whereby the glass-tube fuse is surface mounted on the printed board. In this manner, according to the present invention, a glass-tube fuse can be surface mounted on a printed board by using a mounter.

The fuse holder component of this invention having the suction surface provided in the suction portion extending from the main body portion of the second side plate is simple in construction and shape, and hence can be easily fabricated, for instance by stamping a metal sheet with improved efficiency in using the metal sheet. Thus, it can be fabricated efficiently at low costs.

Preferably, the fuse holder component further comprises an extension portion extending from the axially outer half of the main body portion of the second side plate, and the suction portion extends from the extension portion substantially in parallel to the bottom plate. With this preferred embodiment where the suction surface extends above the bottom plate substantially in parallel to the bottom plate, it is possible to make the mounting of the fuse holder component on a printed board from right above, with the suction surface and the bottom of the fuse holder component held substantially in parallel to the printed board. Thus, the fuse holder component can be mounted by using a mounter even on a printed board on which various electrical components including fuse holder components are to be densely mounted.

Preferably, the second side plate has an engaging portion extending toward the bottom plate from an axially inner edge of the suction portion and adapted to be abutted against an axially outer end face of the glass-tube fuse. This preferred embodiment makes it possible to prevent the glass-tube fuse inserted between the side plates of the fuse holder component from moving outward in the axial direction of the bottom plate. Thus, a fuse holder constituted by a pair of fuse holder components can hold the glass-tube fuse in place, and an electrical contact failure between caps of the glass-tube fuse and the fuse holder can be prevented that is caused by an undesired axial movement of the glass-tube fuse.

Preferably, the first side plate has a first guide portion extending outward in the width direction of the bottom plate from an axially inner half of the main body portion of the first side plate, and the second side plate has a second guide portion extending outward in the width direction of the bottom plate from an axially inner half of the main body portion of the second side plate. This preferred embodiment makes it easy by means of a guiding function of the first and second guide portions to insert a cap of a glass-tube fuse between the first and second side plates of the fuse holder component.

Preferably, a projection is formed in an upper face of a widthwise central part of an axially inner half of the bottom plate. With this preferred embodiment, the main body portions of the first and second side plates cooperate with the projection of the bottom plate to support a cap of a glass-tube fuse by line contact in three places, making it possible to stably support the glass-tube fuse at a location spaced upwardly from a printed board, and to prevent an electrical contact failure between the cap of the glass-tube fuse and the side plates of the fuse holder component.

Preferably, the bottom plate is soldered to the printed board. More preferably, notches are formed in axial ends of the bottom plate. For instance, these notches are formed into a semicircular shape as viewed in plane. The bottom plate is formed so that the axial ends of the bottom plate are located slightly outward with respect to axial ends of the first and second side plates in the axial direction of the bottom plate, respectively.

In soldering the bottom plate of the fuse holder component to a printed board, molten solder adheres to peripheries of the notches formed in the bottom plate so that the surface tension of the molten solder is uniformized in various directions in which the surface tension exerts on the bottom plate. This makes it possible to accurately mount the fuse holder component in position on the printed board, and to improve the resistance of solder against separation caused by tension forces applied thereto in various directions.

Preferably, the first and second side plates include connecting portions curved in transverse section and extending from the side edges of the bottom plate to the main body portions of the side plates, respectively. This preferred embodiment improves the ability of the side plates to hold a glass-tube fuse.

DETAILED DESCRIPTION

Figure 1:
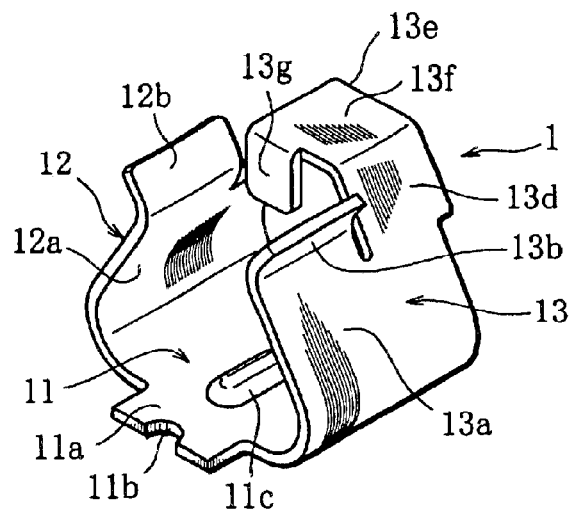
FIG. 1 is a perspective view showing a fuse holder component according to one embodiment of this invention.
Figure 2:
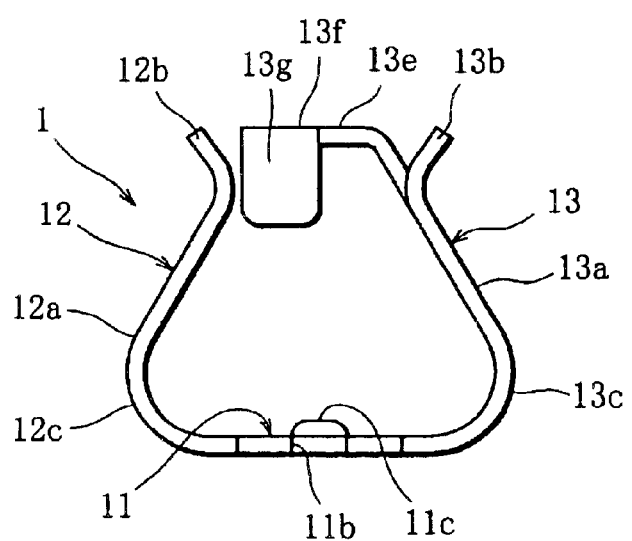
FIG. 2 is a front view of the fuse holder component shown in FIG. 1.
Figure 3:
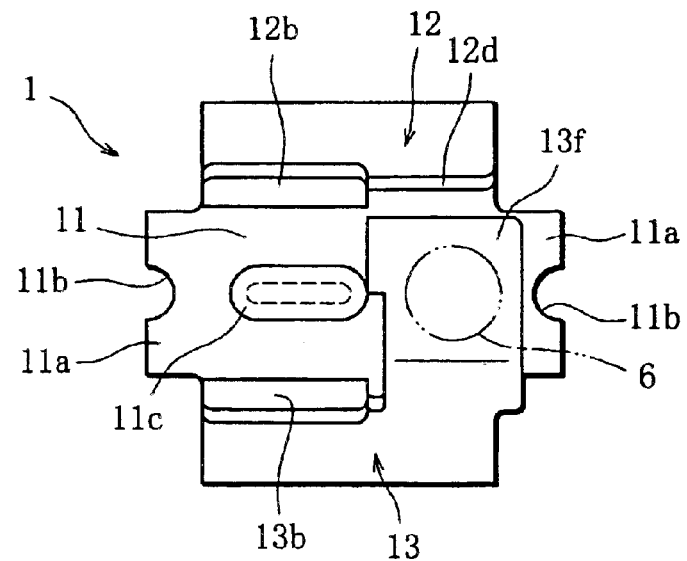
FIG. 3 is a plan view of the fuse holder component.

With reference to FIGS. 1–3, a fuse holder component according to an embodiment of this invention will be explained.

The fuse holder component 1 comprises a flat bottom plate 11 and first and second side plates 12, 13 individually extending from side edges of the bottom plate 11, and is formed as a whole into an inverted Ω shape as viewed from front.

The first side plate 12 comprises a connecting portion 12c extending from one side edge of the bottom plate 11 and curved in circular arc in transverse section, a main body portion 12 obliquely extending from the connecting portion 12c upward and inward in the width direction of the bottom plate, and a first guide portion 12b extending from an axially inner half of the main body portion 12a outward in the width direction of the bottom plate. Similarly, the second side plate 13 includes a connecting portion 13c extending from another side edge of the bottom plate 11 and curved in circular arc, a main body portion 13a obliquely extending from the connecting portion 13c upward and inward in the width direction, and a second guide portion 13b extending from an axially inner half of the main body portion 13a outward in the width direction.

The fuse holder component 1 is formed such that the distance between proximal ends of the guide portions 12b, 13b is narrower than the outer diameter of a cap 5a of a glass-tube fuse 5 (see FIG. 4) and the distance between connecting portions 12c, 13c is wider than the cap diameter.

The curved connecting portions 12c, 13c exhibit a spring characteristic improving the ability of the main body portions 12a, 13a of the side plates to hold the cap 5a of the glass-tube fuse 5. In a state where the fuse is held between the side plates 12, 13, the main body portions 12a, 13a of these side plates are in contact at their inner surfaces with the cap 5 and electrically connected therewith. The guide portions 12b, 13b exhibit a guide function when the cap 5 is being inserted between the side plates 12, 13.

The second side plate 13 further comprises an extension portion 13d extending from an axially outer half of the main body portion 13a, and a suction portion 13e extending from the extension portion 13d substantially in parallel to the bottom plate 11. The suction portion 13e is provided with a suction surface 13f to which a suction nozzle 6 (shown in schematic form in FIG. 3) of a mounter is accessible. The second side plate 13 includes an engaging portion 13g extending toward the bottom plate 11 from an axially inner edge of the suction portion 13e. The engaging portion 13g extends at substantially right angles or at an obtuse angle slightly larger than right angles with respect to the suction surface 13f, and is adapted to be resiliently abutted against an outer end face 5b of the glass-tube fuse 5, thereby preventing an axially outward movement of the glass-tube fuse 5. The engaging portion 13g has a width that is about half the width of the suction surface 13f.

The first side plate 12 is not provided with an extension portion corresponding to the extension portion 13d of the second side plate 13. Specifically, the first side plate 12 terminates at an upper edge 12d (refer to FIG. 3) of the main body portion 12 on the side of the axially outer half of this plate.

The bottom plate 11 has its axial ends 11a individually located slightly outward with respect to axial ends of the side plates 12, 13 in the axial direction of the fuse holder component 1. Notches 11b that are semicircular in plane are formed in a widthwise central part of the ends 11a of the bottom plate 11, and a projection 11c is provided in an upper face of a widthwise central part of an axially inner end of the bottom plate 11.

The fuse holder component 1 is formed as a whole into one piece by press stamping a metal sheet having a spring property and electrical conductivity. The fuse holder component 1 constituted by the bottom plate 11 and the side plates 12, 13 integral with one another is simple in construction and shape, whereby the efficiency in using a metal sheet can be improved and the stamping can be made with ease. This makes it possible to improve the efficiency and cost-effectiveness in the fabrication of fuse holder components 1.

A pair of fuse holder components 1 serving as a fuse holder are transported in sequence to predetermined positions (soldering portions) 3 on the upper face 2a of a printed board 2 by means of a mounter provided with a suction nozzle 6 (FIG. 3) sucking the suction surface 13f of each fuse holder component. The fuse holder components 1 are placed on the printed board 2 with their engaging portions 13 facing each other, and the bottom plates 11 of the fuse holder components are reflow-soldered to the printed board 2.

During the soldering, molten solder adheres to the peripheries of semicircular notches 11b formed in the axial ends of the bottom plate 11 of each fuse holder component 1, so that the surface tension of the molten solder is uniformized in various directions in which the surface tension exerts on the bottom plate 11. As a result, the fuse holder components 1 are soldered in position on the printed board, and the resistance of solder against separation caused by tension forces applied thereto in various directions. In the above manner, the paired fuse holder components 1 are surface mounted on the printed board 2 by using the mounter.

Figure 4:
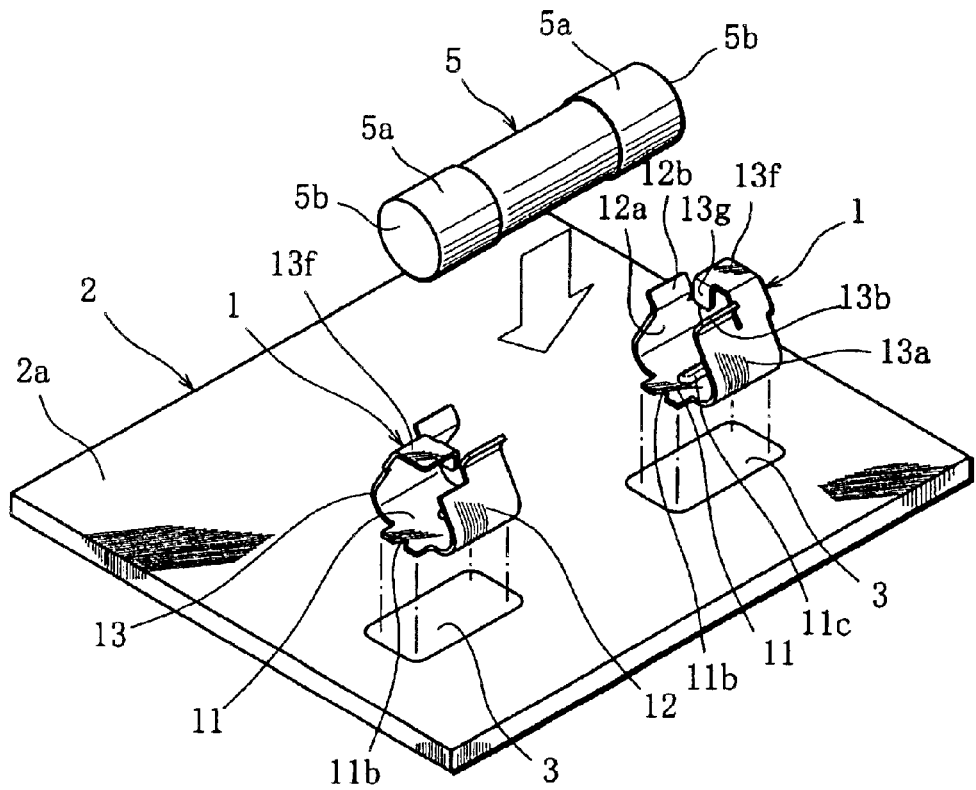
FIG. 4 is a perspective view showing a pair of fuse holder components, a printed board, and a glass-tube fuse.
Figure 5:
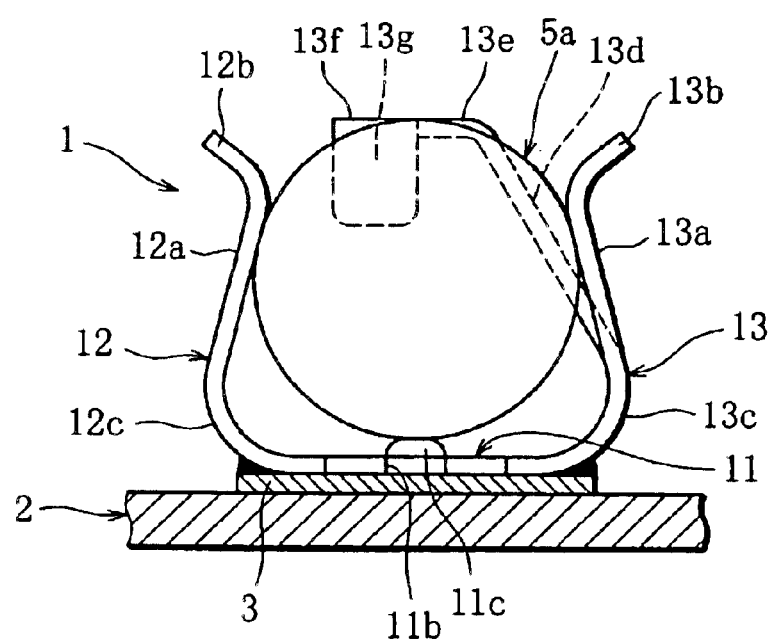
FIG. 5 is an enlarged view showing, partly in section, how a fuse holder component is in contact with a glass-tube fuse mounted thereto.

As shown by arrow in FIG. 4, a glass-tube fuse 5 is inserted via guide portions 12b, 13b of the paired fuse holder components 1 into between the engaging portions 13g and between the first and second side plates 12, 13 of the components against spring forces of these portions. As a result, each of caps 5a of the glass-tube fuse 5 is supported by inner faces of the main body portions 12a, 13a of the side plates 12, 13 and an upper face of the projection 11c of the bottom plate 11 of a corresponding one of the fuse holder components 1, so as to be in line contact in three places with the individual fuse holder component. Thus, the glass-tube fuse 5 is mechanically held by the fuse holder components 1 and the caps 5a of the glass-tube fuse are electrically connected to the fuse holder components with reliability.

Since end faces 5b of the caps 5a of the glass-tube fuse 5 are resiliently abutted against the engaging portions 13a of the fuse holder components 1, the glass-tube fuse 5 is prevented from being axially displaced when and after inserted between the fuse holder components, thereby eliminating a contact failure between the caps 5a and the side plates 12, 13 of the fuse holder components which would be caused by an axial displacement of the glass-tube fuse. Since the caps 5a are placed on the projections 11c of the bottom plates 11 of the fuse holder components 1, the mounting position of the glass-tube fuse 5 is spaced upwardly from the upper face 2a of the printed board 2, making it possible to securely mount the glass-tube fuse 5 to the fuse holder components 1 and to prevent a contact failure.

The present invention is not limited to the foregoing embodiment, and may be modified variously. For instance, in this invention, it is not essentially required to form a projection in the bottom plate or to form notches in the ends of the fuse holder component.

What is claimed is:

1. A fuse holder component formed as a single piece comprising:
   a bottom plate adapted to be fixed to a printed board;
   a first side plate having a main body portion attached to and obliquely extending from one side edge of said bottom plate upward and inward in a width direction of said bottom plate; and
   a second side plate including a main body portion and a suction portion extending from an outer half of the main body portion,
   wherein the main body portion of said second side plate cooperates with the main body portion of said first side plate to hold a cap of a glass-tube fuse, and the suction portion has a suction surface to which a suction nozzle of a mounter is accessible.

2. The fuse holder component according to claim 1, further comprising:
   an extension portion extending from the outer half of the main body portion of said second side plate,
   wherein the suction portion extends from the extension portion substantially in parallel to said bottom plate.

3. The fuse holder component according to claim 1, wherein said first side plate has a first guide portion extending outward in the width direction of said bottom plate from an inner half of the main body portion of said first side plate, and
   said second side plate has a second guide portion extending outward in the width direction of said bottom plate from an inner half of the main body portion of said second side plate.

4. The fuse holder component according to claim 1, wherein a projection is formed in an upper face of a widthwise central part of an inner half of said bottom plate.

5. The fuse holder component according to claim 1, wherein said first and second side plates include connecting portions curved in transverse section and extending from the side edges of said bottom plate to the main body portions of said first and second side plates, respectively.

6. The fuse holder component according to claim 1, wherein said bottom plate is soldered to the printed board.

7. The fuse holder component according to claim 6, wherein notches are formed in axial ends of said bottom plate.

8. The fuse holder component according to claim 7, wherein the notches are formed into a semicircular shape as viewed in plane.

9. The fuse holder component according to claim 7, wherein said bottom plate is formed so that the axial ends of said bottom plate are located slightly outward with respect to axial ends of said first and second side plate, respectively, in an axial direction of said bottom plate.

10. The fuse holder component according to claim 1, wherein said second side plate has an engaging portion extending toward said bottom plate from an inner edge of the suction portion and adapted to be abutted against an axially outer end face of the glass-tube fuse.

11. The fuse holder component according to claim 10, wherein the width of the engaging portion is substantially half the width of the suction surface.

12. The fuse holder component according to claim 10, wherein the engaging portion is substantially flat.

13. The fuse holder component according to claim 10, wherein the engaging portion extends at a substantially right angle from the suction portion.

14. The fuse holder component according to claim 10, wherein the engaging portion extends at an obtuse angle greater than a right angle from the suction portion.

* * * * *